United States Patent
Bang et al.

(10) Patent No.: US 6,850,450 B2
(45) Date of Patent: Feb. 1, 2005

(54) FUSE BOX INCLUDING MAKE-LINK AND REDUNDANT ADDRESS DECODER HAVING THE SAME, AND METHOD FOR REPAIRING DEFECTIVE MEMORY CELL

(75) Inventors: Kwang-kyu Bang, Youngin (KR); Kyeong-seon Shin, Youngin (KR); Sang-seok Kang, Youngin (KR); Hyen-wook Ju, Youngin (KR); Jeong-ho Bang, Yongin (KR); Ho-Jeong Choi, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 170 days.

(21) Appl. No.: 10/075,568

(22) Filed: Feb. 13, 2002

(65) Prior Publication Data

US 2003/0026147 A1 Feb. 6, 2003

(30) Foreign Application Priority Data

Aug. 2, 2001 (KR) ........................................ 2001-46805

(51) Int. Cl.[7] .............................................. G11C 11/00
(52) U.S. Cl. .................................... 365/225.7; 365/200
(58) Field of Search .............................. 365/200, 225.7

(56) References Cited

U.S. PATENT DOCUMENTS

| | | | | |
|---|---|---|---|---|
| 5,257,229 A | * | 10/1993 | McClure et al. | 365/200 |
| 5,262,994 A | * | 11/1993 | McClure | 365/200 |
| 5,265,054 A | * | 11/1993 | McClure | 365/200 |
| 5,295,102 A | * | 3/1994 | McClure | 365/200 |
| 5,455,798 A | * | 10/1995 | McClure | 365/200 |
| 5,471,426 A | * | 11/1995 | McClure | 365/200 |
| 5,491,444 A | * | 2/1996 | McClure | 327/525 |
| 5,612,918 A | * | 3/1997 | McClure | 365/200 |
| 5,691,945 A | * | 11/1997 | Liou et al. | 365/200 |
| 5,790,462 A | * | 8/1998 | McClure | 365/200 |
| 6,097,645 A | * | 8/2000 | Penney et al. | 365/200 |
| 6,208,569 B1 | * | 3/2001 | Patel et al. | 365/200 |
| 6,421,284 B1 | * | 7/2002 | Sakata | 365/200 |
| 6,668,344 B1 | * | 12/2003 | Sakata et al. | 714/710 |
| 6,674,667 B2 | * | 1/2004 | Forbes | 365/185.24 |

FOREIGN PATENT DOCUMENTS

| | | | | |
|---|---|---|---|---|
| JP | 406295594 A | * | 10/1994 | G11C/29/00 |
| JP | 02000012699 A | * | 1/2000 | H01L/21/82 |

* cited by examiner

*Primary Examiner*—Viet Q. Nguyen
(74) *Attorney, Agent, or Firm*—F. Chau & Associate, LLC (57) ABSTRACT

A fuse box including make-links and a redundancy address decoder including the fuse box are provided. It is preferable that the fuse box includes a plurality of make-links for programming an address of a defective normal memory cell with an address of a corresponding redundant memory cell, and the address is a row address or a column address. The redundant address decoder includes a fuse box having a plurality of make-links for decoding an address of a defect cell and a redundant word line selection circuit for selecting a word line of a redundant cell corresponding to the address of the defect cell in response to a signal output from the fuse box.

15 Claims, 6 Drawing Sheets

FUSE BOX INCLUDING MAKE-LINK AND REDUNDANT ADDRESS DECODER HAVING THE SAME, AND METHOD FOR REPAIRING DEFECTIVE MEMORY CELL

BACKGROUND OF THE INVENTION

1. Field of the Invention

The present invention generally relates to a semiconductor memory device and a decoding method therein, and more particularly, to a fuse box capable of decoding a row/column address of a defective memory cell, a redundant address decoder including the fuse box, and a method of repairing a defective memory cell.

2. Description of the Related Art

For an increase in yield in a semiconductor memory device, a normal memory cell array and a redundancy cell array are included so that a normal memory cell in which a defect occurs (hereinafter, 'defect cell') can be replaced with a redundancy memory cell (hereinafter, 'redundant cell').

As is well known in the related technical field, a semiconductor memory device includes a redundancy circuit to replace a defect cell with a redundant cell. The redundancy circuit includes program means for programming the address of the defect cell and a predetermined control circuit for controlling the redundancy circuit. The program means has several fuses that decode the address of the defect cell through laser or electric current to replace the defect cell with the redundancy cell.

Previously, one defect cell was replaced with one redundant cell. However, this replacement is disadvantageous in that the layout areas of the program means and the redundancy circuit having the program means are greatly increased.

Accordingly, to reduce the layout area of the redundancy circuit, one redundancy global word line is used to replace one normal global word line. One normal global word line drives four sub-word lines and one redundancy global word line drives four sub-redundancy word lines.

Figure 1:
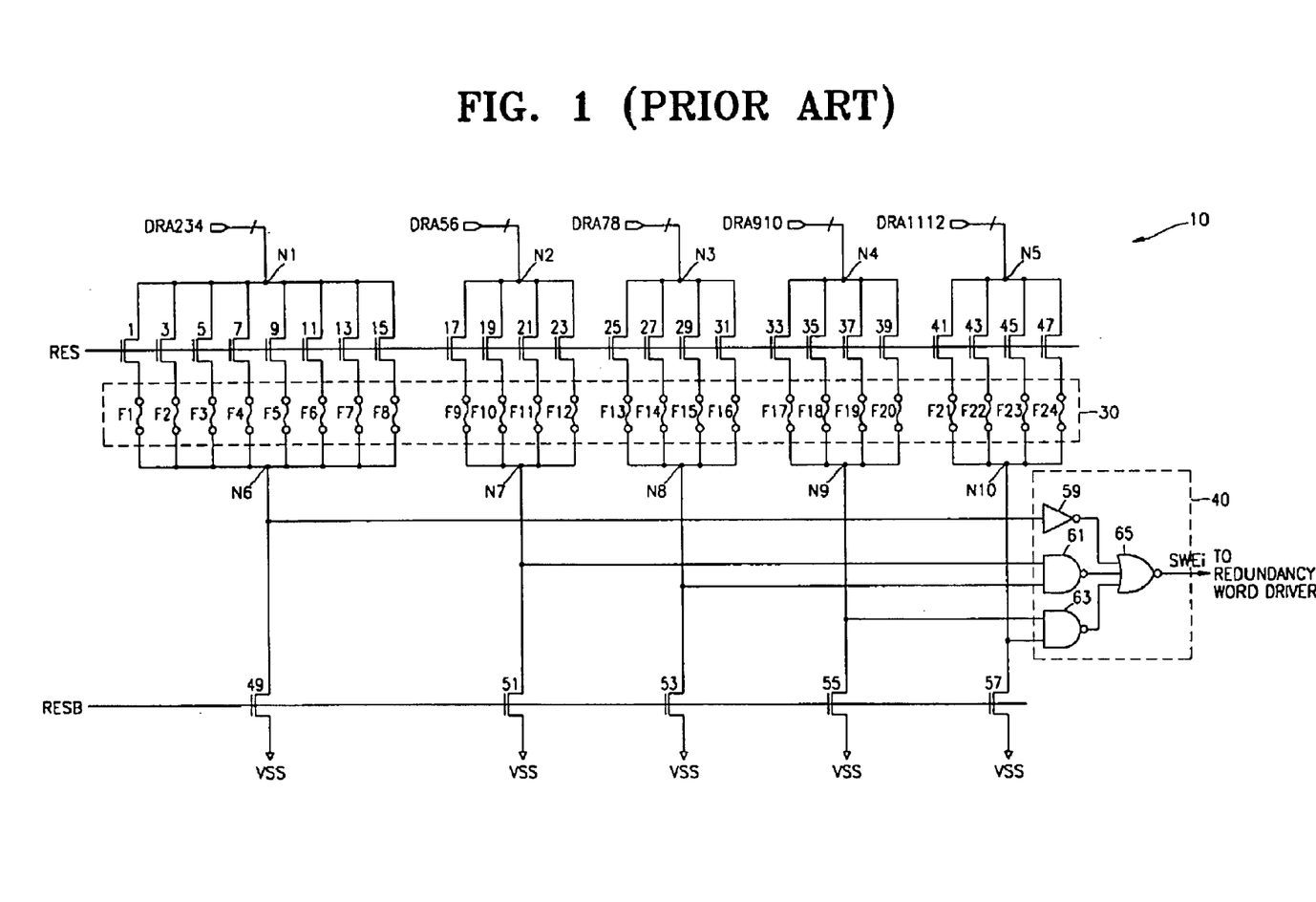
FIG. 1 is a view of a conventional redundant row address decoder using poly-silicon fuses.

FIG. 1 is a view of a circuit structure of a conventional redundant row address decoder that uses a poly-silicon fuse. In a redundant row address decoder 10, one normal global word line can be replaced with one redundancy global word line.

The redundant row address decoder 10 includes a plurality of transistors 1 through 57, a fuse box 30 and a redundancy word line selection circuit 40.

The redundant row address decoder 10 decodes the input row address signals DRA234, DRA56, DRA78, DRA910 and DRA112 and activates a redundancy global word line SWEi corresponding to the row address signals. When the redundancy global word line SWEi is activated, a defect cell is replaced with a redundant cell.

A pair of complimentary signals RES and RESB that control the redundancy row address decoder 10 are generated from a redundancy control signal generation circuit (not shown). When a redundancy operation is performed, a redundancy enable signal RES is activated and as a result, transistors 1 through 27 which transmit the address signals DRA234, DRA56, DRA78, DRA910 and DRA112 of the defect cell, are turned on. However, during normal operations, transistors 49, 51, 53, 55 and 57 are turned on in response to the activated complementary redundancy enable signal RESB and, therefore, the redundancy global word line SWEi is inactivated.

The fuse box 30 includes a plurality of fuses F1 through F24. The plurality of fuses F1 through F24 are poly-silicon fuses which can be cut with a laser or electric current and are selectively cut to represent the address of the defect cell.

The redundancy word line selection circuit 40 includes a plurality of inversion circuits 59, 61 and 63 and an NOR gate 65, as shown in FIG. 1.

A case when one redundancy global word line SWEi is selected will be described now with respect to FIG. 1. Fuses F2 through F9, F11 through F13, F15 through F18 and F20 through F23 are cut when the redundancy enable signal RES is activated, the address DRA234 of the defect cell is <000>, the address DRA78 is <01>, the address DRA910 is <10> and the address DRAL 112 is <11>. As a result, the address of the defect cell is decoded by the fuse box 30.

The redundancy word line selection circuit 40 responds to signals of nodes N6 through N10, e.g., logic 'high', and outputs the activated redundancy global word line enable signal SWEi to a redundancy word driver (not shown). The redundancy word driver responds to the activated redundancy global word line enable signal SWEi and activates four sub-redundancy word lines connected to the redundancy global word line.

However, while one normal global word line is replaced with one redundancy global word line, normal memory cells of a plurality of memory cells connected to one normal global word line may also be replaced with redundant cells, thus deteriorating product characteristics.

Figure 2:
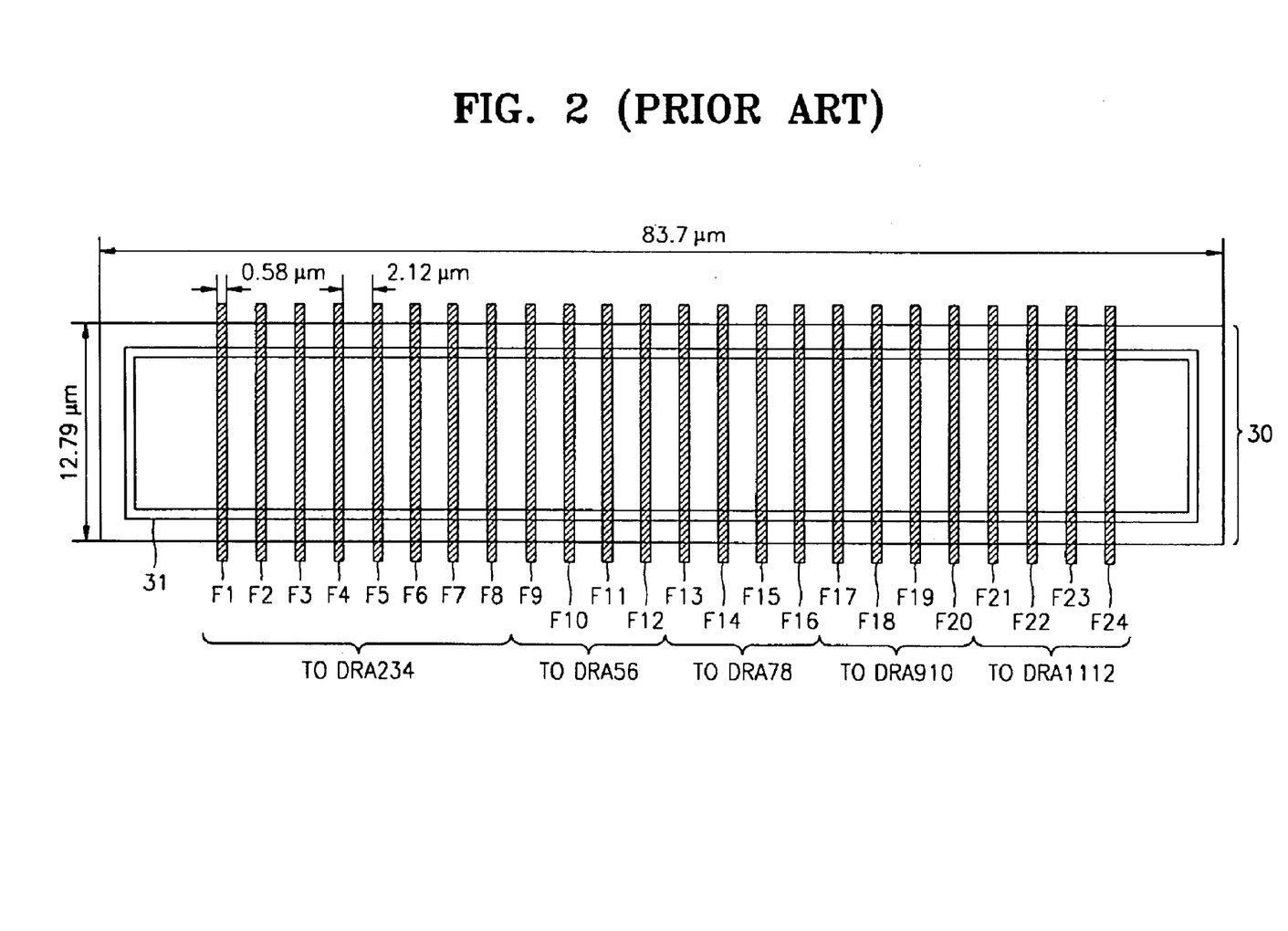
FIG. 2 is a plan view of the layout of the fuse box shown in FIG. 1.

FIG. 2 is a plan view of the layout of the fuse box shown in FIG. 1. Referring to FIG. 2, in a conventional fuse box 30, twenty-four fuses F1 through F24 are laid out on an area of 83.7 $\mu$m in width and 12.79 $\mu$m in length considering a distance between fuses which are capable of decoding the row address of the defect cell (the distance is called 'fuse pitch'). Each of the addresses DRA234, DRA56, DRA78, DRA910 and DRAL112 are input to the twenty-four fuses F1 through F24 through the transistors 1 through 47.

However, the layout area of the conventional fuse box 30 can be reduced only within a limited range because there is a limitation in reducing the fuse pitch. Also, during replacing one normal global word line with one redundancy global word line, normal memory cells connected to one normal global word line may also be replaced with redundant cells, thus decreasing redundancy efficiency.

SUMMARY OF THE INVENTION

To solve the above and other related problems of the prior art, there is provided a fuse box capable of reducing a layout area as well as increasing redundancy efficiency. There is also provided a redundant row address decoder including the fuse box. Moreover, there is provided a method of replacing a defect cell with a redundant cell using the redundant row address decoder.

According to an aspect of the present invention, there is provided a fuse box that includes a plurality of make-links for programming an address of a defective normal memory cell with an address of a corresponding redundant memory cell. The address is preferably a row address or a column address.

According to another aspect of the present invention, there is provided a redundant row address decoder that includes a fuse box having a plurality of make-links for decoding an address of a defect cell and a redundant word line selection circuit for selecting a word line of a redundant cell corresponding to the address of the defect cell in response to a signal output from the fuse box.

According to yet another aspect of the present invention, there is provided a redundancy method of replacing a defect cell with a redundant cell. An address of the defect cell is received, the address of the defect cell is decoded through make-links, and a redundant word line corresponding to the address of the defect cell is selected and finally, the defect cell is replaced with a redundant cell.

BRIEF DESCRIPTION OF THE DRAWINGS

The above object and advantages of the present invention will become apparent by describing in detail preferred embodiments thereof with reference to the attached drawings in which.

DETAILED DESCRIPTION OF THE INVENTION

Hereinafter, the present invention will be described in detail by explaining preferred embodiments thereof with reference to the attached drawings. It is to be appreciated that identical reference numerals in the drawings denote the same members.

Figure 3:
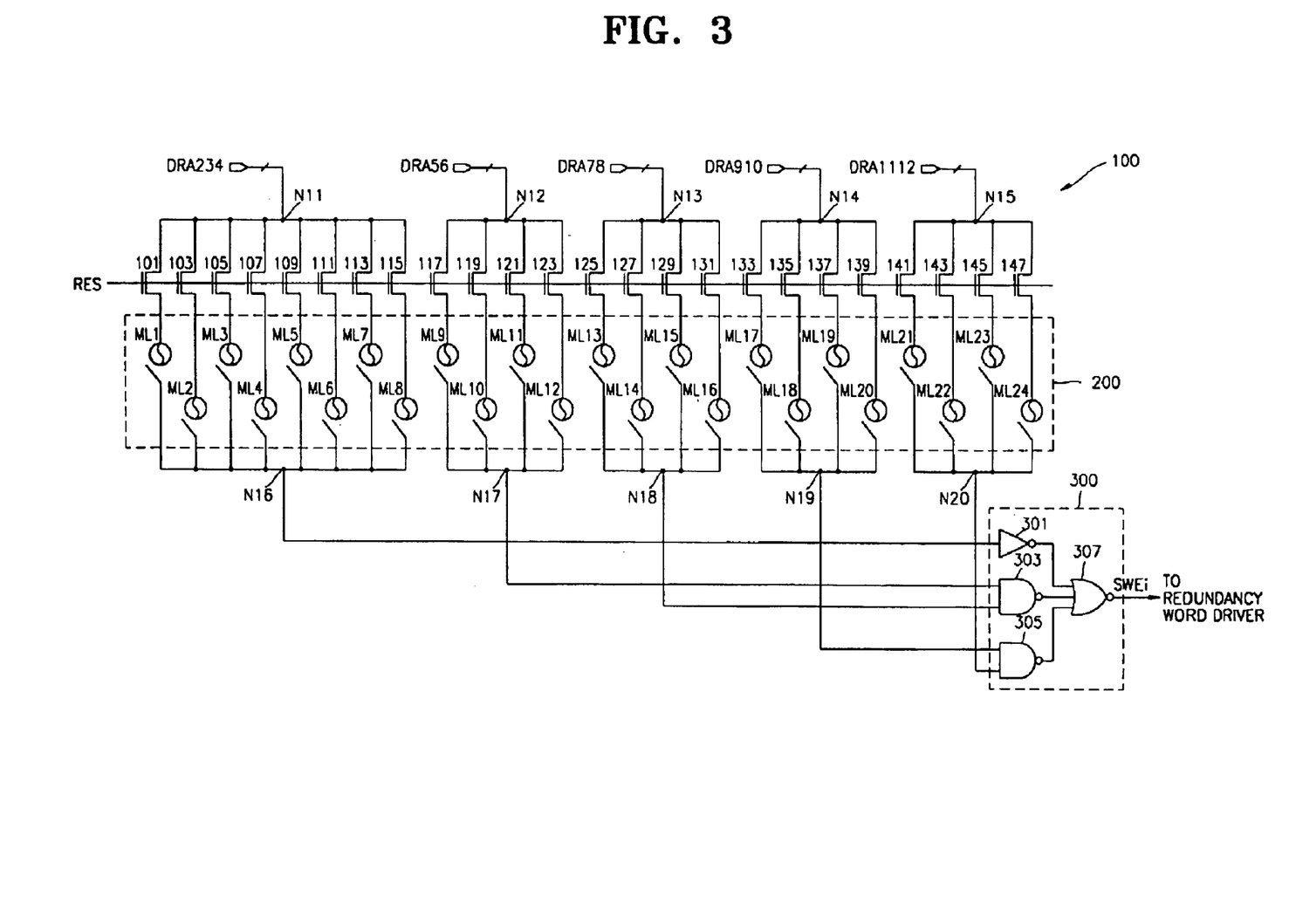
FIG. 3 is a view of a redundant row address decoder including make-links, according to a preferred embodiment of the present invention.

FIG. 3 illustrates a circuit structure of a redundant row address decoder having make-links, according to a preferred embodiment of the present invention. A redundant row address decoder 100 has a structure in which one normal global word line is replaced with one redundancy global word line.

The redundant row address decoder 100 includes a plurality of transistors 101 through 147, a fuse box 200, and a redundancy word line selection circuit 300.

Preferably, the fuse box 200 includes a plurality of fuses ML1 through ML24 and each of the plurality of fuses ML1 through ML24 is composed of make-links or anti-fuses. Make-links ML1 through ML24 are selectively in contact with electricity so that they decode a defect cell.

The make-links ML1 through ML8 are electrically connected to a node N16 and to a source of transistors 101 through 115, respectively. A drain of each of the transistors 101 through 115 is connected to a node N11 and the redundancy enable signal RES is input to a gate of each of the transistors 101 through 115. The address DRA234 of the defect cell address is input to the node N11.

The make-links ML9 through ML12 are electrically connected to a node N17 and to the source of transistors 117 through 123, respectively. A drain of each of the transistors 117 through 123 is connected to a node N12 and the redundancy enable signal RES is input to a gate of each of the transistors 117 through 123. The address DRA56 of the defect cell is input to the node N12.

The make-links ML13 through ML16 are electrically connected to a node N18 and to the source of transistors 125 through 131, respectively. A drain of each of the transistors 125 through 131 is connected to a node N13 and the redundancy enable signal RES is input to a gate of each of the transistors 125 through 131. The address DRA78 of the defect cell is input to the node N13.

The make-links ML17 through ML20 are electrically connected to a node N19 and to the source of transistors 133 through 139. A drain of each of the transistors 133 through 139 is connected to a node N14 and the redundancy enable signal RES is input to a gate of each of the transistors 133 through 139. The address DRA910 of the defect cell address is input to the node N14.

The make-links ML21 through ML24 are electrically connected to a node N20 and to the source of transistors 141 through 147, respectively. A drain of each of the transistors 141 through 147 is connected to a node N15 and the redundancy enable signal RES is input to a gate of each of the transistors 141 through 147. The address DRA112 of the defect cell is input to the node N15.

The redundancy word line selection circuit 300 includes first through fourth logic gates 301, 303, 305 and 307. The first logic gate 301 is an inverter for inverting a signal of the node N16, the second logic gate 303 is a NAND gate for performing a NAND operation on signals output from the nodes N17 and N18, the third logic gate 305 is an NAND gate for performing a NAND operation on signals output from the nodes N19 and N20, and the fourth logic gate 307 is an NOR gate for performing a NOR operation on signals output from the logic gates 301, 303 and 305.

The redundancy word line selection circuit 300 responds to signals output from the fuse box 200 and outputs a redundancy global word line enable signal SWEi to a redundancy word driver (not shown). The redundancy word driver activates the redundancy global word line and four sub-redundancy word lines connected to the redundancy global word line are therefore activated.

Referring to FIG. 3, a case where the redundancy global word line enable signal SWEi is activated will now be explained. If the address DRA234 is <000>, then only the make-link ML1 is electrically connected to the node 16 and the source of transistor 101. If the address DRA56 is <00>, then only the make-link ML9 is electrically connected to the node 17 and the source of the transistor 117. If the address DRA78 is <01>, then only the make-link ML14 is electrically connected to the node 18 and the source of the transistor 127. If the address DRA910 is <10>, then only the make-link ML19 is connected to the node 19 and the source of the transistor 137. If the address DRA1112 is <11>, then only the make-link ML24 is electrically connected to the node 20 and the source of the transistor 147.

When a defect cell is replaced with a redundant cell, the redundancy enable signal RES is activated. Therefore, the transistors 101 through 147 are turned on in response to the redundancy enable signal RES and the make-links ML1 through ML24 are decoded to correspond to the addresses DRA234, DRA56, DRA78, DRA910 and DRAL112 of the defect cells as described above.

Then, the addresses DRA234, DRA56, DRA78, DRA910 and DRA1112 of the defect cells are respectively transmitted to the nodes N16 through N20 through the fuse box 200. The redundancy word line selection circuit 300 outputs the redundancy global word line enable signal SWEi to the redundancy word driver in response to signals of the nodes N16 through N20, e.g., logic 'high'.

Figure 4:
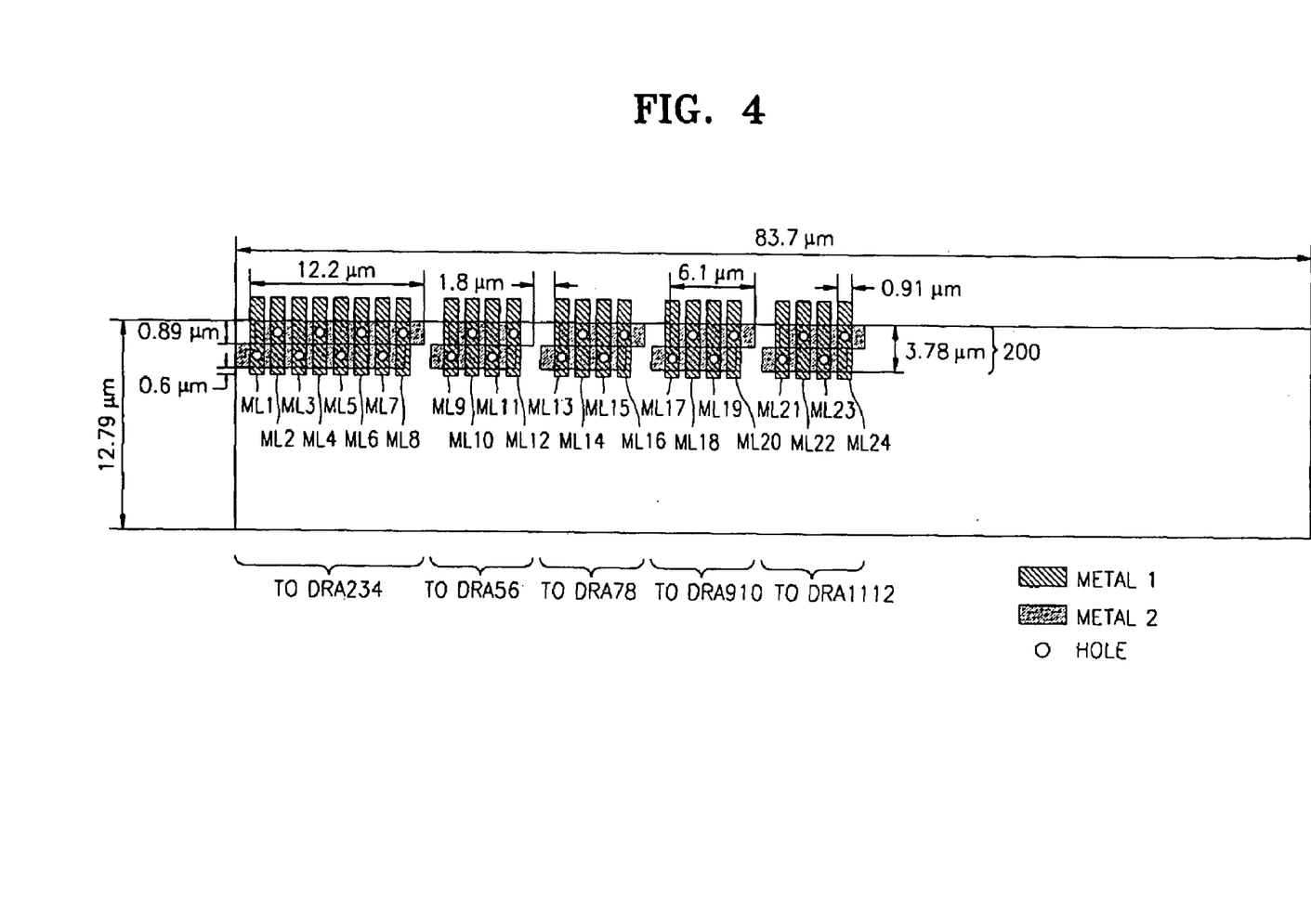
FIG. 4 is a plan view of the layout of the fuse box including the make-links shown in FIG. 3, according to an illustrative embodiment of the present invention.

FIG. 4 shows a plan view of the layout of a fuse box including the make-link shown in FIG. 3, according to an illustrative embodiment of the present invention. Numerical values shown in FIG. 4 are illustrative of the effect of the present invention; the present invention is not restricted thereto and can be modified in various ways.

Referring to FIG. 4, the make-links ML1 though ML24 are created by positioning two strips of a conductive material, in this case represented by Metal 1 and Metal 2. As shown, one or more conductors (Metal 1) in a first layer have their elongated axis disposed at a substantially perpendicular angle relative to one or more conductors (Metal 2) in a second layer. When a particular make-link needs to be closed, a connection between the two conductors is initiated. Positioning the conductive material Metal 1 and Metal 2 in such a fashion affords a space savings over traditional approaches. As can be seen from FIG. 4, this method of crossing conductive material affords the ability to create nodes efficiently in terms of space, as exemplified by the conductive material used to create make-links ML9 through ML16. Here, Metal 2 is used to form the node N17 of FIG. 3.

Referring to FIG. 4, the layout area of the fuse box 200 having the make-links ML1 through ML24 is narrower than that of the fuse box 30 (shown in FIG. 2) having the poly-silicon fuses F1 through F24. That is, the layout area of the fuse box according to the present invention is one eighth of that of a conventional fuse box. Also, the fuse pitch (distance between ML1 and ML2) in FIG. 4 is considerably smaller than that (distance between F1 and F2) in FIG. 2.

Specifically, the layout area of the poly-silicon fuses shown in FIG. 2 is 21.6$\mu$m in width and 12.79 $\mu$m in length, whereas that of the make-links (ML1 through ML8) is 12.2 $\mu$m in width and 3.78 $\mu$m in length. Accordingly, the layout area of the fuse box 200 including the make-links ML1 through ML24 according to a preferred embodiment of the present invention can be reduced to one eighth of that of the fuse box 30.

Figure 5:
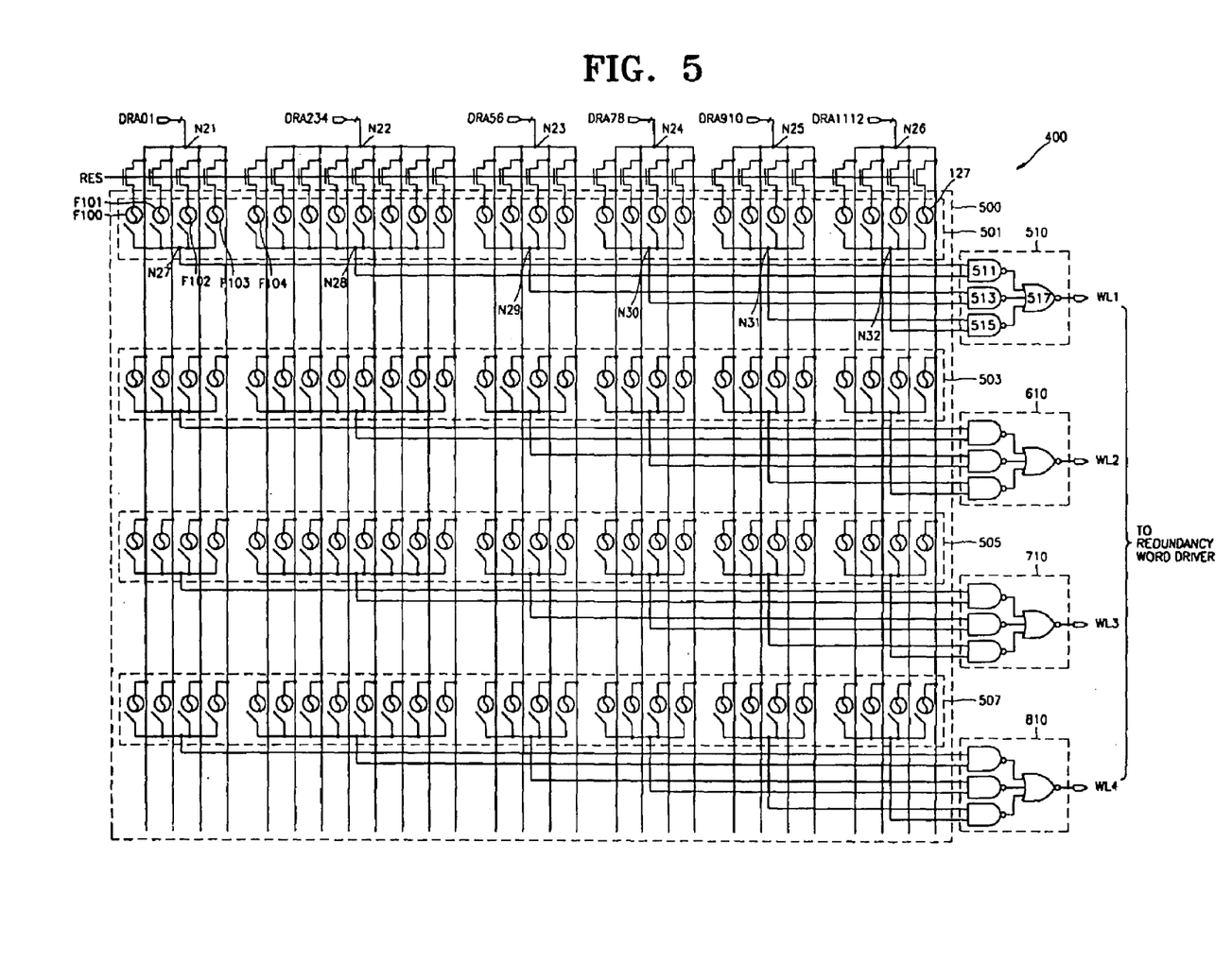
FIG. 5 is a view of a redundant row address decoder including make-links, according to another preferred embodiment of the present invention.

FIG. 5 illustrates a circuit structure of a redundant row address decoder including make-links, according to another illustrative embodiment of the present invention. Referring to FIG. 5, a redundant row address decoder 400 has a structure in which a defect cell is replaced with a redundant cell.

The redundant row address decoder 400 includes a plurality of transistors, a fuse box 500 and redundancy word line selection circuits 510, 610, 710 and 810.

Figure 6:
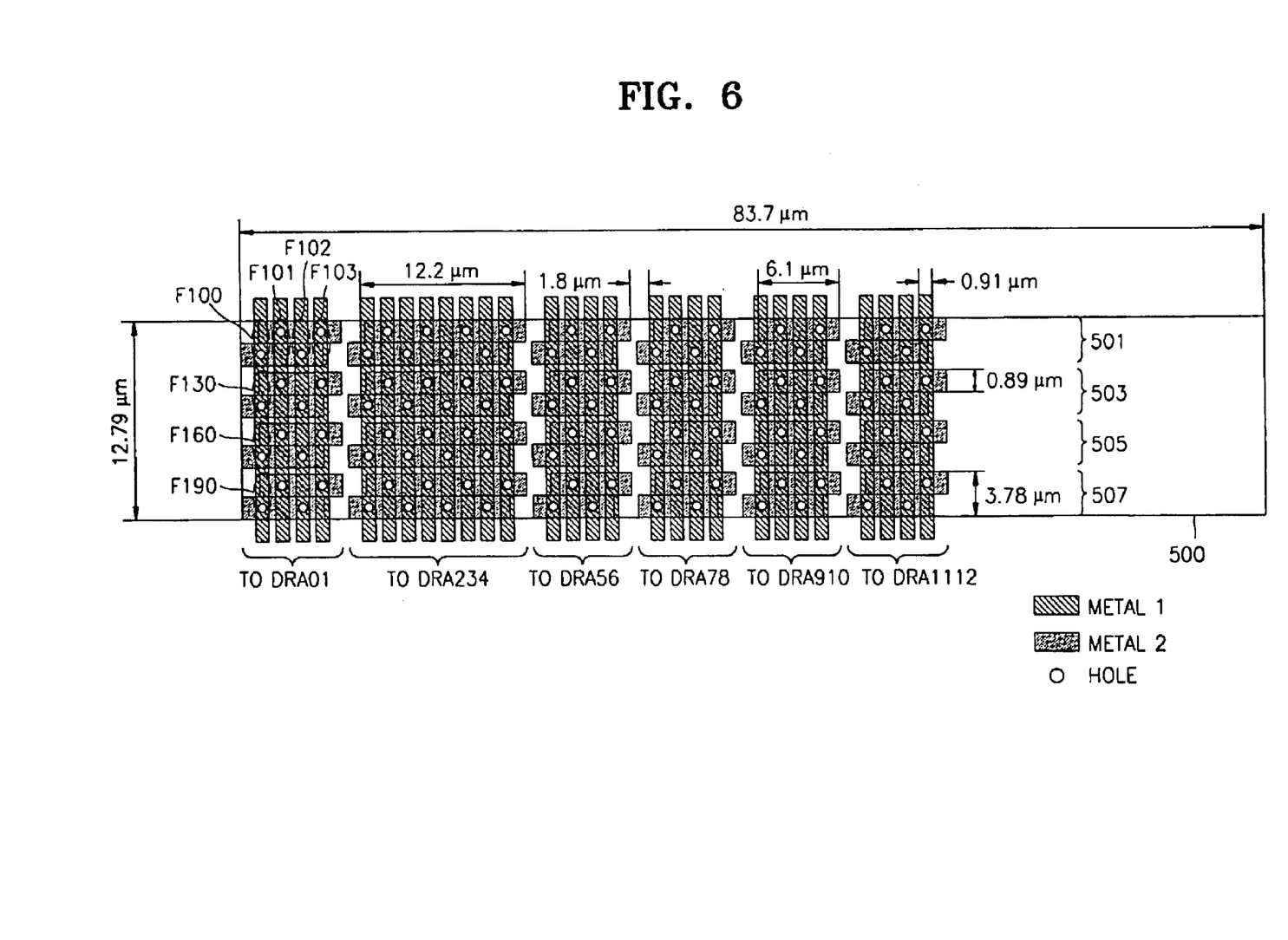
FIG. 6 is a plan view of the layout of the fuse box including make-links shown in FIG. 5, according to an illustrative embodiment of the present invention.

The fuse box 500 includes a first fuse box 501, a second fuse box 503, a third fuse box 505 and a fourth box 507. Each of the fuse boxes 501, 503, 505 and 507 includes a plurality of make-links as shown in FIG. 6.

Each of the fuse boxes 501, 503, 505 and 507 is decoded through the same method as the fuse box 200 shown in FIG. 3. Also, an address DRA01 is used for selecting a word line. For instance, a word line WL1 is activated when the address DRA01 is <00>and a make-link F100 is programmed, and a word line WL2 is activated when the address DRA01 is <01>and a make-link F101 is programmed.

FIG. 5 illustrates a case when the word line WL1 is selected. The make-link F100 is decoded to indicate the address DRA01 of the defect cell and the other make-links F104 through F127 are decoded to indicate the addresses DRA234, DRA56, DRA78, DRA910 and DRA1112 of the defect cell.

The first fuse box 501 includes a first NAND gate 511, a second NAND gate 513, a third NAND gate 515, and an NOR gate 517. The first fuse box 501 responds to signals of nodes N27 through N32 and outputs a redundancy word enable signal WL1 to the redundancy word driver. Then, the redundancy word driver responds to the redundancy word line enable signal WL1, enables a word line of the redundant cell and drives the redundant cell, thus replacing the defect cell with the redundant cell.

FIG. 6 illustrates a plan view of the layout of the fuse box including make-links shown in FIG. 5, according to an illustrative embodiment of the present invention. Referring to FIG. 6, according to the layout structure of the fuse box 500, a defect cell is replaced with a redundant cell, and four fuse boxes 501, 503, 505 and 507 are included. In the fuse box 500, a laser beam is shone into a hole causing a reaction on metals 1 and 2, thereby performing switching.

The fuse boxes 501, 503, 505 and 507 are created in a fashion similar to that of the individual fuse box depicted in FIG. 4. Conductors (Metal 1) in a first layer have their elongated axis disposed at a substantially perpendicular angle relative to conductors (Metal 2) in a second layer. As in the fuse box depicted in FIG. 4, this positioning of conductive material allows the space efficient interconnection of the make-links to each other, as depicted in FIG. 5. An example of such interconnections can be seen by the make-links identified by reference numerals F100, F130, F160 and F190. Here, a strip of Metal 1 interconnects all four make-links.

As can be seen from FIG. 6, the layout area of the fuse box 500 including the four fuse foxes 501, 503, 505 and 507 is reduced to about a half of that of the fuse box 30 shown in FIG. 2.

As described above, the layout area of a fuse box including make-links according to the present invention can be reduced to an eighth of that of a conventional fuse box including a poly-silicon fuse. Therefore, the layout area of a redundant row address decoder including the fuse box can be remarkably reduced. The fuse box according to the present invention can be applied to a redundant column decoder.

The layout area of a fuse box according to the present invention is reduced to an eighth of that of a conventional fuse box including fuses, and thus, the layout area of a redundant row address decoder according to the present invention can be considerably reduced.

Also, a fuse box including make-links according to the present invention has a reduced layout area and is capable of selectively repairing a defective word line or bit line, thereby enhancing redundancy efficiency and product quality.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A fuse box, comprising:
   a plurality of make-links for programming an address of a defective normal memory cell with an address of a corresponding redundant memory cell, wherein the make-links are formed by at least one conductor in a first layer having its elongated axis disposed at a substantially perpendicular angle relative to at least one conductor in a second layer.

2. The fuse box of claim 1, wherein the address of the defective normal memory cell and the address of the corresponding redundant memory cell are row addresses or column addresses.

3. A fuse box as defined in claim 1, where the plurality of make-links are disposed to replace a defective normal bit line with a corresponding redundant bit line.

4. A fuse box as defined in claim 1 where the plurality of make-links are disposed to replace a defective normal word line with a corresponding redundant word line.

5. A redundant address decoder, comprising:
a fuse box including a plurality of make-links for decoding an address of a defect cell, where each of the make-links includes a first end and a second end;
a redundant word line selection circuit for selecting a word line of a redundant cell corresponding to the address of the defect cell in response to a signal output from the fuse box;
a redundancy enable signal line;
a plurality of transistors, each of the plurality of transistors having a source connected to the first end of one of the plurality of make-links and a gate connected to said redundancy enable signal line; and
a plurality of nodes, each of the plurality of nodes connected to the second end of one of the plurality of make-links.

6. The redundancy address decoder of claim 5, further comprising another plurality of nodes for receiving defect cell addresses, wherein each of the plurality of transistors has a drain connected to one of the other plurality of nodes.

7. A redundant address decoder, comprising:
a fuse box including a plurality of make-links for decoding an address of a defect cell, where each of the make-links includes a first end and a second end;
a redundant bit line selection circuit for selecting a bit line of a redundant cell corresponding to the address of the defect cell in response to a signal output from the fuse box;
a redundancy enable signal line;
a plurality of transistors, each of the plurality of transistors having a source connected to the first end of one of the plurality of make-links and a gate connected to said redundancy enable signal line; and
a plurality of nodes, each of the plurality of nodes connected to the second end of one of the plurality of make-links.

8. The redundancy address decoder of decoder of claim 7, further comprising another plurality of nodes for receiving defect cell addresses, wherein each of the plurality of transistors has a drain connected to one of the other plurality of nodes.

9. A method for repairing a defective memory cell, comprising the steps of:
receiving an address of the defective cell;
decoding the address of the defective cell through make-links, wherein the make-links are formed by at least one conductor in a first layer having its elongated axis disposed at a substantially perpendicular angle relative to at least one conductor in a second layer; and
selecting a redundant word line corresponding to the address of the defective cell and replacing the defective cell with a redundant cell.

10. A redundant address decoder, comprising:
a fuse box including a plurality of make-links for decoding an address of a defect cell, where each of the make-links includes a first end and a second end;
a plurality of transistors, each of the plurality of transistors having a source connected to the first end of one of the plurality of make-links, respectively;
a plurality of nodes, each of the plurality of nodes connected to the second end of one of the plurality of make-links, respectively; and
a redundant word line selection circuit for selecting a word line of a redundant cell corresponding to the address of the defect cell in response to a signal output from the fuse box, wherein the redundant word line selection circuit includes an inverter connected to a first one of the plurality of nodes for performing an inversion operation, a first NAND gate connected to second and third ones of the plurality of nodes for performing a NAND operation, a second NAND gate connected to fourth and fifth ones of the plurality of nodes for performing the NAND operation, and a NOR gate connected to the inverter as well as both the first and second NAND gates for performing a NOR operation.

11. The redundancy address decoder of claim 10, wherein each of the plurality of transistors have a gate connected to a redundancy enable signal line.

12. The redundancy address decoder of claim 11, further comprising another plurality of nodes for receiving defect cell addresses, wherein each of the plurality of transistors has a drain connected to one of the other plurality of nodes.

13. A redundant address decoder, comprising:
a fuse box including a plurality of make-links for decoding an address of a defect cell, where each of the make-links includes a first end and a second end; and
a plurality of transistors, each of the plurality of transistors having a source connected to the first end of one of the plurality of make-links, respectively;
a plurality of nodes, each of the plurality of nodes connected to the second end of one of the plurality of make-links, respectively; and
a redundant word line selection circuit for selecting a word line of a redundant cell corresponding to the address of the defect cell in response to a signal output from the fuse box, wherein the redundant word line selection circuit includes an inverter connected to a first one of the plurality of nodes for performing an inversion operation, a first NAND gate connected to second and third ones of the plurality of nodes for performing a NAND operation, a second NAND gate connected to fourth and fifth ones of the plurality of nodes for performing the NAND operation, and a NOR gate connected to the inverter as well as both the first and second NAND gates for performing a NOR operation.

14. The redundancy address decoder of claim 13, wherein each of the plurality of transistors have a gate connected to a redundancy enable signal line.

15. The redundancy address decoder of claim 14, further comprising another plurality of nodes for receiving defect cell addresses, wherein each of the plurality of transistors has a drain connected to one of the other plurality of nodes.

* * * * *